United States Patent
Kim et al.

(10) Patent No.: US 10,515,757 B2
(45) Date of Patent: Dec. 24, 2019

(54) INTERNAL COIL STRUCTURE AND METHOD FOR OPERATING THE SAME IN A WIRELESS TERMINAL

(71) Applicant: Samsung Electronics Co., Ltd., Suwon-si, Gyeonggi-do (KR)

(72) Inventors: Yoon-Geon Kim, Seoul (KR); Seung-Tae Ko, Bucheon-si (KR); Sang-Ho Lim, Suwon-si (KR); Won-Bin Hong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/822,009

(22) Filed: Nov. 24, 2017

(65) Prior Publication Data

US 2018/0096787 A1 Apr. 5, 2018

Related U.S. Application Data

(63) Continuation of application No. 15/336,144, filed on Oct. 27, 2016, now Pat. No. 9,831,031.

(30) Foreign Application Priority Data

Oct. 27, 2015 (KR) .................. 10-2015-0149171

(51) Int. Cl.
*H04B 1/38* (2015.01)
*H01Q 1/22* (2006.01)
(Continued)

(52) U.S. Cl.
CPC ............. *H01F 38/14* (2013.01); *G04G 21/04* (2013.01); *G04R 60/06* (2013.01); *G06F 1/163* (2013.01);
(Continued)

(58) Field of Classification Search
CPC .......... H04B 5/02; H04B 1/38; H04B 1/3827; H04B 1/385; H01Q 1/22; H01Q 1/27;
(Continued)

(56) References Cited

U.S. PATENT DOCUMENTS 5,312,643 A 5/1994 Yamamoto et al.
8,889,998 B2 11/2014 Ogino
(Continued)

FOREIGN PATENT DOCUMENTS

| CN | 104253298 A | 12/2014 |
|---|---|---|
| KR | 10-2010-0108062 A | 10/2010 |
| KR | 1051537 B1 | 7/2011 |

OTHER PUBLICATIONS

European Search Report dated Aug. 1, 2018, issued in the European Application No. 16860247.2.

*Primary Examiner* — Blane J Jackson
(74) *Attorney, Agent, or Firm* — Jefferson IP Law, LLP

(57) ABSTRACT

A coil arrangement structure supporting wireless communication and a method for operating the same in a wireless terminal are provided. The coil arrangement structure includes a closed-loop metal frame and a coil arranged asymmetrically within the metal frame. The coil is arranged such that a distance between an outer side of the coil and an inner side of the metal frame is not constant and the coil is arranged integrally on a front surface of a display.

17 Claims, 19 Drawing Sheets

(51) Int. Cl.
*H01Q 7/00* (2006.01)
*H01F 38/14* (2006.01)
*G06F 1/16* (2006.01)
*H05K 1/18* (2006.01)
*H01Q 1/27* (2006.01)
*G04G 21/04* (2013.01)
*G04R 60/06* (2013.01)
*H01Q 3/24* (2006.01)
*H04B 5/00* (2006.01)
*G04R 20/26* (2013.01)

(52) U.S. Cl.
CPC .............. *H01Q 1/27* (2013.01); *H01Q 1/273* (2013.01); *H01Q 3/24* (2013.01); *H01Q 7/00* (2013.01); *H04B 5/0031* (2013.01); *H04B 5/0081* (2013.01); *H05K 1/18* (2013.01); *G04R 20/26* (2013.01); *H01F 2038/143* (2013.01); *H05K 2201/1003* (2013.01)

(58) Field of Classification Search
CPC ............ H01Q 1/273; H01Q 3/00; H01Q 7/00; H01Q 7/005
See application file for complete search history.

(56) References Cited

U.S. PATENT DOCUMENTS

| | | | |
|---|---|---|---|
| 9,542,335 B1 | 1/2017 | Elving | |
| 9,547,335 B1* | 1/2017 | Bevelacqua | H01Q 1/273 |
| 2007/0129208 A1 | 6/2007 | Willmot et al. | |
| 2010/0164818 A1* | 7/2010 | Kusunoki | G04G 21/04 343/718 |
| 2010/0321325 A1 | 12/2010 | Springer et al. | |
| 2012/0026009 A1 | 2/2012 | Zhao et al. | |
| 2012/0133597 A1 | 5/2012 | Chen | |
| 2013/0099994 A1 | 4/2013 | Yosui | |
| 2013/0147670 A1 | 6/2013 | Nakano et al. | |
| 2013/0162594 A1 | 6/2013 | Paulsen et al. | |
| 2014/0080411 A1 | 3/2014 | Konanur et al. | |
| 2014/0141835 A1 | 5/2014 | Zhu et al. | |
| 2014/0179224 A1* | 6/2014 | Liao | H01Q 1/273 455/41.1 |
| 2014/0191916 A1 | 7/2014 | Ito | |
| 2014/0218262 A1 | 8/2014 | Tsubaki | |
| 2014/0247188 A1 | 9/2014 | Nakano et al. | |
| 2015/0130765 A1 | 5/2015 | Paulsen | |
| 2015/0207205 A1 | 7/2015 | Kato et al. | |
| 2015/0214619 A1 | 7/2015 | Shimizu et al. | |
| 2015/0214620 A1 | 7/2015 | Yosui | |
| 2015/0249916 A1 | 9/2015 | Schlub et al. | |
| 2015/0278562 A1 | 10/2015 | Adrangi et al. | |
| 2016/0049721 A1* | 2/2016 | Aizawa | H01Q 1/273 343/718 |
| 2016/0058375 A1 | 3/2016 | Rothkopf | |
| 2016/0099497 A1* | 4/2016 | Lee | H01Q 1/38 343/702 |
| 2016/0254587 A1 | 9/2016 | Jung et al. | |
| 2016/0285757 A1 | 9/2016 | Srivastava et al. | |
| 2016/0344096 A1* | 11/2016 | Erentok | H01Q 1/273 |
| 2017/0093021 A1 | 3/2017 | Kim et al. | |
| 2017/0099084 A1* | 4/2017 | Endo | H04B 5/0056 |

\* cited by examiner

INTERNAL COIL STRUCTURE AND METHOD FOR OPERATING THE SAME IN A WIRELESS TERMINAL

CROSS-REFERENCE TO RELATED APPLICATION(S)

This application is a continuation application of prior application Ser. No. 15/336,144, filed on Oct. 27, 2016, which will issue as U.S. Pat. No. 9,831,031 on Nov. 28, 2017 and claimed the benefit under 35 U.S.C. § 119(a) of a Korean patent application filed on Oct. 27, 2015, in the Korean Intellectual Property Office and assigned Serial number 10-2015-0149171, the entire disclosure of which is hereby incorporated by reference.

TECHNICAL FIELD

The present disclosure relates to a coil arrangement structure supporting wireless communication and a method for operating the coil arrangement structure in a wireless terminal.

BACKGROUND

To satisfy demands for wireless data traffic, which have been increasing since commercialization of a $4^{th}$ generation (4G) communication system, efforts have been made to develop a $5^{th}$ generation (5G) or pre-5G communication system. A 5G or pre-5G communication system may be referred to as beyond 4G network communication system or a post long term evolution (LTE) system.

To achieve high data rates, deployment of the 5G communication system in a millimeter wave (mmWave) frequency band (for example, a 60-GHz band) is under consideration. In order to mitigate propagation path loss and increase a propagation distance in the mmWave band, beamforming, massive multiple input multiple output (MIMO), full dimensional MIMO (FD-MIMO), array antenna, analog beamforming, and large-scale antenna technology have been discussed for the 5G communication system.

Further, to improve a system network, techniques such as evolved small cell, advanced small cell, cloud radio access network (cloud RAN), ultra-dense network, device-to-device (D2D) communication, wireless backhaul, moving network, cooperative communication, coordinated multi-point (CoMP), and received interference cancelation have been developed for the 5G communication system.

Besides, advanced coding modulation (ACM) techniques such as hybrid frequency-shift keying (FSK) and quadrature amplitude modulation (QAM) (FQAM), sliding window superposition coding (SWSC), advanced access techniques such as filter bank multi carrier (FBMC) and non-orthogonal multiple access (NOMA), and sparse code multiple access (SCMA) have been developed for the 5G communication system.

Along with the development of various communication schemes as described above, there is a pressing need for techniques of efficiently supporting the communication schemes in a wireless terminal. Further, miniaturization of the wireless terminal is required to enhance the portability of the wireless terminal.

In general, even though more and more parts are used to add functions to the wireless terminal, the increase of the size of the wireless terminal is to be prevented through efficient arrangement of the parts, in consideration of the portability of the wireless terminal. Moreover, as a number of parts are integrated in a small area, the effects and influences between parts should also be considered in the wireless terminal.

Particularly, the wireless terminal needs sufficient space for ensuring coil inductance. However, this is not easy for a small device having spatial limitations or a wearable device which also should consider the effects from a human body.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an internal coil arrangement structure and a method for operating the structure, which avoid effects from other parts in a wireless terminal.

Another aspect of the present disclosure is to provide an internal coil arrangement structure and a method for operating the structure, which avoid effects from an outer metal component in a wireless terminal having the outer metal component.

Another aspect of the present disclosure is to provide an asymmetrical coil structure and a method for operating the asymmetrical coil structure, which minimize the effects of induced current caused by other parts in a wireless terminal.

In accordance with an aspect of the present disclosure, a coil arrangement structure supporting a predetermined communication scheme in a wireless terminal is provided. The coil arrangement structure includes a closed-loop metal frame and a coil arranged asymmetrically within the metal frame. The coil is arranged such that a distance between an outer side of the coil and an inner side of the metal frame is not constant and the coil is arranged integrally on a front surface of a display.

In accordance with another aspect of the present disclosure, a method for conducting communication in a predetermined communication scheme by operating a plurality of coils arranged in an asymmetrical structure within a metal frame in a wearable terminal is provided. The method includes determining a wearing state of the wearable terminal based on a signal generated by at least one sensor, selecting at least one of the plurality of coils based on the determined wearing state, and establishing communication using a predetermined communication scheme corresponding to the selected at least one of the plurality of coils using the selected at least one of the plurality of coils.

In accordance with another aspect of the present disclosure, a wearable terminal supporting communication in a plurality of communication schemes is provided. The wearable terminal includes at least one sensor, a closed-loop metal frame, a plurality of coils arranged asymmetrically within the metal frame and arranged integrally on a front surface of a display, and a communication processor. The communication processor being configured to determine a wearing state of the wearable terminal based on a signal generated by at least one sensor, select at least one of the plurality of coils based on the determined wearing state, and establish communication using a predetermined communication scheme corresponding to the selected at least one of the plurality of coils using the selected at least one of the plurality of coils.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
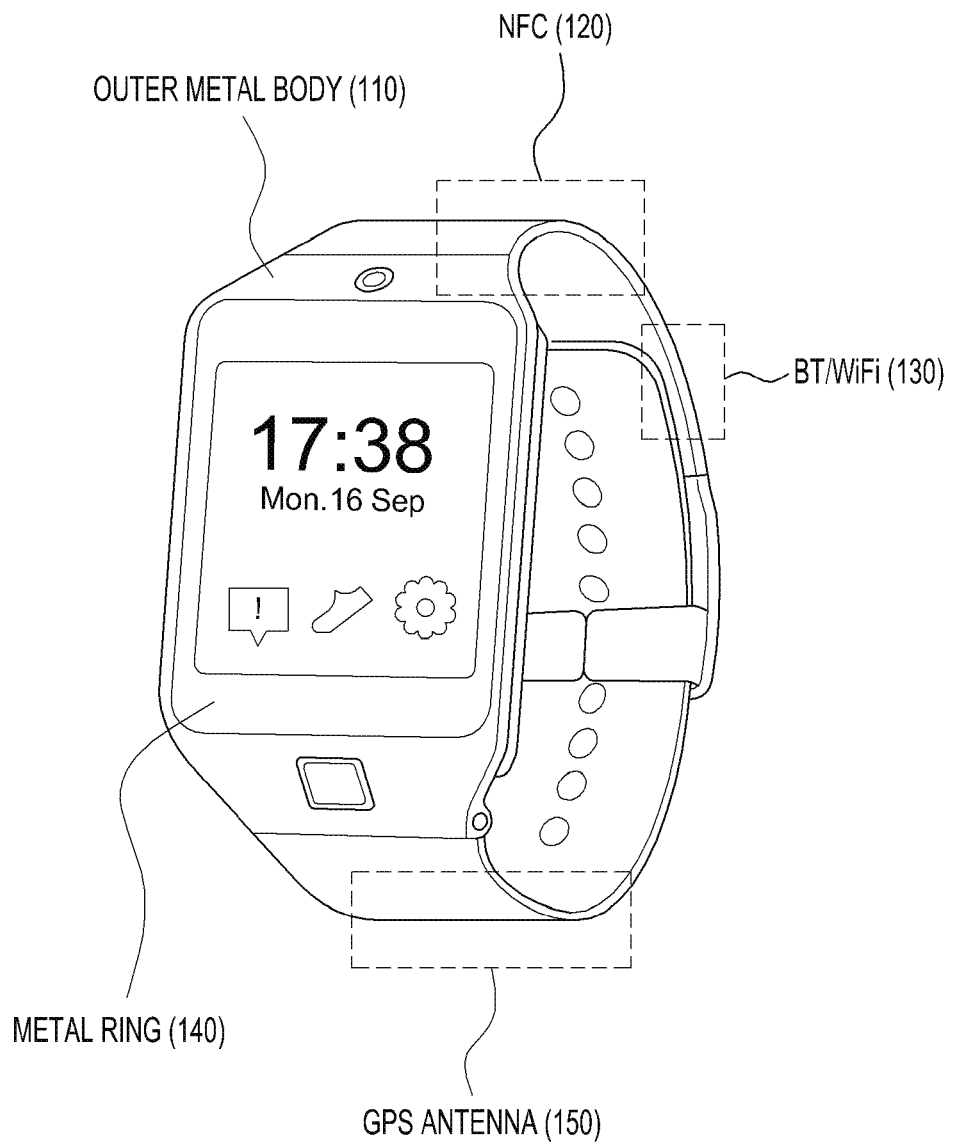
FIG. 1 illustrates an exterior of a smart watch as an example of a wearable device being a wireless terminal according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the present disclosure, the term 'have', 'may have', 'include', or 'may include' signifies the presence of a specific feature (for example, number, function, operation, or component such as part), not excluding the presence of one or more other features.

In present disclosure, the term 'A or B', 'at least one of A or/and B', or 'one or more of A or/and B' may cover all possible combinations of enumerated items. For example, 'A or B', 'at least one of A and B', or 'at least one of A or B' may represent all of the cases of (1) inclusion of at least one A, (2) inclusion of at least one B, and (3) inclusion of at least one A and at least one B.

The term as used in the present disclosure, 'first' or 'second' may modify the names of various components irrespective of sequence and/or importance, not limiting the components. These expressions are used to distinguish one component from another component. For example, a first user equipment (UE) and a second UE may indicate different UEs irrespective of sequence or importance. For example, a first component may be referred to as a second component and vice versa without departing the scope of the present disclosure.

When it is said that a component (for example, a first component) is 'operatively or communicatively coupled with/to' or 'connected to' another component (for example, a second component), it should be understood that the one component is connected to the other component directly or through any other component (for example, a third component). On the other hand, when it is said that a component (for example, a first component) is 'directly connected to' or 'directly coupled to' another component (for example, a second component), it may be understood that there is no other component (for example, a third component) between the components.

The term 'configured to' as used herein may be replaced with, for example, the term 'suitable for' having the capacity to', 'designed to', 'adapted to', 'made to', or 'capable of' under circumstances. The term 'configured to' may not necessarily mean 'specifically designed to' in hardware. Instead, the term 'configured to' may mean that a device may mean 'capable of' with another device or part. For example, 'a processor configured to execute A, B, and C' may mean a dedicated processor (for example, an embedded processor) for performing the corresponding operations or a generic-purpose processor (for example, a central processing unit (CPU) or an application processor (AP)) for performing the operations.

Unless otherwise defined, the terms and words including technical or scientific terms used in the following description and claims may have the same meanings as generally understood by those skilled in the art. The terms as generally defined in dictionaries may be interpreted as having the same or similar meanings as or to contextual meanings of related technology. Unless otherwise defined, the terms should not be interpreted as ideally or excessively formal meanings. When needed, even the terms as defined in the present disclosure may not be interpreted as excluding embodiments of the present disclosure.

A wireless terminal according to various embodiments of the present disclosure may be at least one of, for example, a smartphone, a tablet, a personal computer (PC), a mobile phone, a video phone, an e-book reader, a desktop PC, a laptop PC, a netbook computer, a workstation, a server, a personal digital assistant (PDA), a portable multimedia player (PMP), a Moving Picture Experts Group phase 1 or phase 2 (MPEG-1 or MPEG-2) audio layer 3 (MP3) player, mobile medical equipment, a camera, or a wearable device. According to various embodiments, the wearable device may be at least one of an accessory type (for example, a watch, a ring, a bracelet, an ankle bracelet, a necklace, glasses, contact lenses, or a head-mounted device (HMD)), a fabric or clothes type (for example, electronic clothes), a body-attached type (for example, a skin pad or a tattoo), or an implantable type (for example, an implantable circuit).

According to various embodiments, a wireless terminal may be a home appliance. For example, the home appliance may be at least one of, for example, a television (TV), a digital versatile disc (DVD) player, an audio player, a refrigerator, an air conditioner, a vacuum cleaner, an oven, a microwave oven, a washer, an air purifier, a set-top box, a home automation control panel, a security control panel, a TV box (for example, Samsung HomeSync™, Apple TV™, Google TV™, or the like), a game console (for example, Xbox™, PlayStation™, or the like), an electronic dictionary, an electronic key, a camcorder, or an electronic picture frame.

According to other embodiments, a wireless terminal may be at least one of a medical device (for example, a portable medical meter such as a blood glucose meter, a heart rate meter, a blood pressure meter, or a body temperature meter, a magnetic resonance angiography (MRA) device, a magnetic resonance imaging (MRI) device, a computed tomography (CT) device, an imaging device, an ultrasonic device, or the like), a navigation device, a global navigation satellite system (GNSS), an event data recorder (EDR), a flight data recorder (FDR), an automotive infotainment device, a naval electronic device (for example, a naval navigation device, a gyrocompass, or the like), an avionic electronic device, a security device, an in-vehicle head unit, an industrial or consumer robot, an automatic teller machine (ATM) in a financial facility, a point of sales (POS) device in a shop, or an internet of things (IoT) device (for example, a lighting bulb, various sensors, an electricity or gas meter, a sprinkler, a fire alarm, a thermostat, a street lamp, a toaster, sports goods, a hot water tank, a heater, or a boiler).

According to various embodiments, a wireless terminal may be at least one of furniture, part of a building/structure, an electronic board, an electronic signature receiving device, a projector, and various measuring devices (for example, water, electricity, gas, or electro-magnetic wave measuring devices). According to various embodiments, a wireless terminal may be one or a combination of two or more of the foregoing devices. According to various embodiments, a wireless terminal may be a flexible electronic device. In addition, it will be apparent to one having ordinary skill in the art that a wireless terminal according to an embodiment of the present disclosure is not limited to the foregoing devices and covers a new electronic device produced along with technology development.

With reference to the attached drawings, various embodiments to be proposed will be described below in detail.

FIG. 1 illustrates an exterior of a smart watch as an example of a wearable device being a wireless terminal according to various embodiments of the present disclosure.

Referring to FIG. 1, the smart watch includes a hand strap so that the smart watch may be worn around a wrist. An antenna or a coil may be arranged in the hand strap in order to support various communication schemes. For example, a coil or an antenna for near field communication (NFC) 120, a coil or an antenna for Bluetooth (BT)/Wi-Fi communication 130, a global positioning system (GPS) antenna 150, and so on may be installed in the hand strap. The smart watch includes an outer metal body 110 and a glass display may be protected by a metal ring 140.

If an antenna or a coil is disposed in the hand strap as described above, this may be advantageous in terms of space. However, heat resulting from communication disconnections may lead to battery consumption. That is why efforts have been made to dispose an antenna or a coil inside a communication terminal.

For example, a coil may be disposed on a display layer in order to support a specific communication scheme. In this case, an H-field generated from the coil does not pass through a metal and may cause an eddy current in the metal near to the coil. The eddy current may be a cause of degradation of device performance. For example, if the exterior of the wireless terminal, such as a case, is formed of a metallic material, the metallic material may affect the internal coil.

Since an eddy current is proportional to a distance, as the gap between the metal body and the coil is smaller, current flowing through the coil may increase the eddy current of the metal body. Therefore, the metal body needs to be spaced sufficiently apart from the coil to reduce the eddy current. That is, it may be preferred to design the coil in such a manner that the distance between the coil and a conductor that may generate an eddy current, like the metal body, may be maximized in a space secured for disposing the coil in the wireless terminal. This design may reduce current loss caused by the eddy current. In addition, an area occupied by the coil may be decreased and a resistance may be increased by disposing the coil only inside the display.

Further, there is a need to consider a communication direction, an antenna position in relation to effects from a human body, and effects from a metal in designing a coil arrangement structure. That is, a transparent coil structure may be applied with respect to the front surface of the display so as to position an antenna in the communication direction. To reduce effects from a human body, the coil may be disposed at a top end of the display furthest from the human body. To reduce the effects from a metal, an asymmetrical coil structure may be used. The asymmetrical structure may increase the strength of a magnetic field. The asymmetrical structure may reduce the metal effects in the narrow space of a wearable device.

Figure 2:
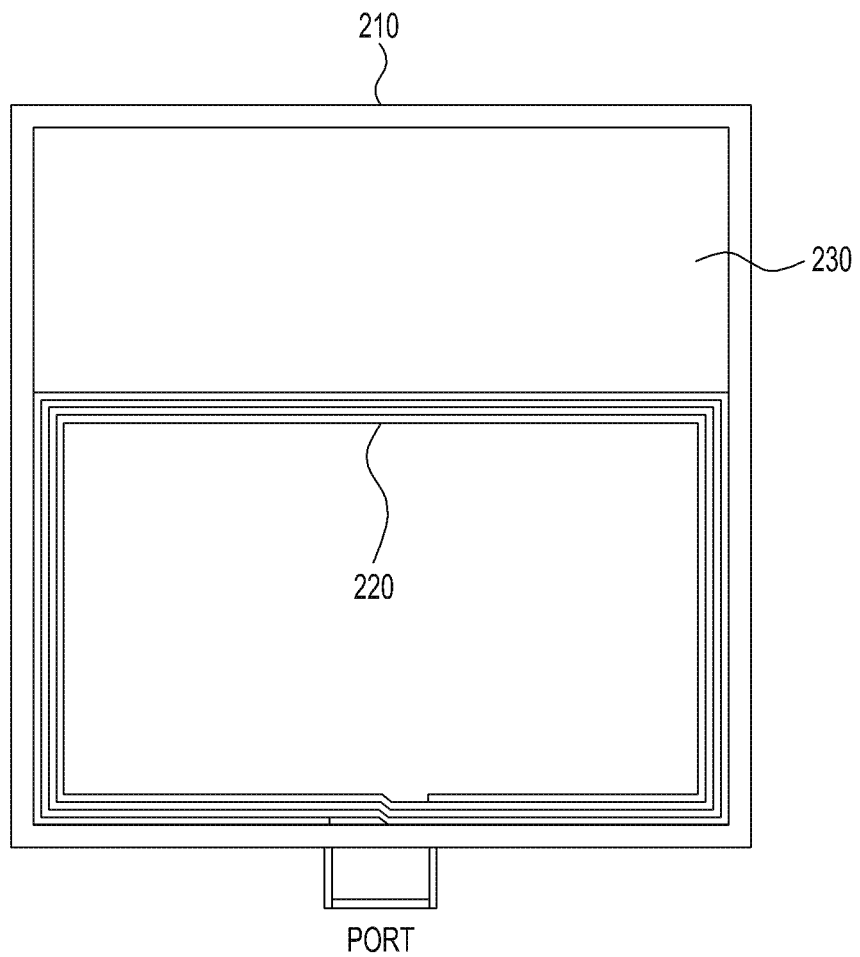
FIG. 2 illustrates a coil arrangement in a wireless terminal according to various embodiments of the present disclosure.

FIG. 2 illustrates a coil arrangement in a wireless terminal according to various embodiments of the present disclosure.

Referring to FIG. 2, a coil 220 may be disposed in an asymmetrical structure within a metal frame 210. The asymmetrical structure may be a structure in which the coil 220 is arranged inside the metal frame 210 such that the center of the metal frame 210 may not match the center of the coil 220. The asymmetrical structure results in a space 230 between the coil 220 and the metal frame 210.

The proposed structure may reduce the intensity of an eddy current that the coil 220 induces in the metal frame 210. As a result, the eddy current flowing through the metal frame 210 may affect the coil 220 less.

In summary, use of a transparent coil based on the front surface of a display and asymmetrical arrangement of the coil so that the coil may be at a position (for example, the top end of the display) farthest from a human body may be a method for reducing the effects of a metal in the wireless terminal.

Figure 3:
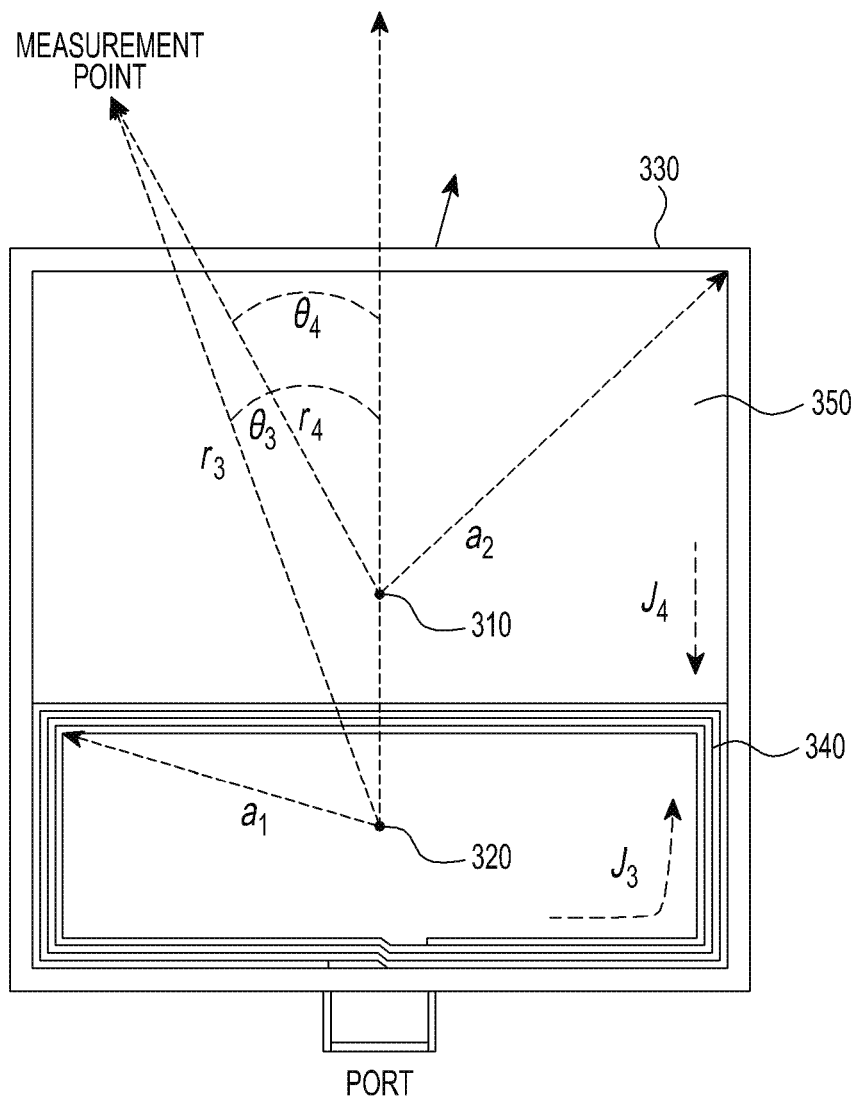
FIG. 3 illustrates an asymmetrical arrangement of a coil within a metal frame according to various embodiments of the present disclosure.

FIG. 3 illustrates an asymmetrical arrangement of a coil within a metal frame according to various embodiments of the present disclosure.

Referring to FIG. 3, it may be noted that a center 310 of a metal frame 330 does not match a center 320 of a coil 340 and a space 350 is disposed between the metal frame 330 and the coil 340. The center 310 of the metal frame 330 may be the weight center of the metal frame 330 and the center 320 of the coil 340 may be the weight center of the coil 340. In the asymmetrical structure, the strength of a whole magnetic field produced by the coil 340 may be increased due to reduction of induced current, that is, an eddy current.

If the upper and lower distances of the coil 340 to the metal frame 330 are equal or the left and right distances of the coil 340 to the metal frame 330 are equal, the center 320 of the coil 340 may match the center 310 of the metal frame 330. However, in this case, the center 320 of the coil 340 may not match the center 310 of the metal frame 330. In other words, if the center 320 of the coil 340 matches the center 310 of the metal frame 330, even though the coil 340 is symmetrically arranged inside the metal frame 330, an eddy current may be reduced.

The following equation defines the weight center of an N-sided polygon.

$$(x_c, y_c) = \left( \frac{\sum_{n=1}^{N} x_n}{N}, \frac{\sum_{n=1}^{N} y_n}{N} \right) \quad \text{Equation 1}$$

Equation 2 defines the strength of a magnetic field outside a coil in a symmetrical structure.

$$H_1 \propto \frac{\alpha_1^2 J_1 e^{-jkr_1}}{4r_3^1} \sin\theta_1 - \frac{\alpha_2^2 J_2 e^{-jkr_2}}{4r_3^2} \sin\theta_2 \quad \text{Equation 2}$$

Equation 3 defines the strength of a magnetic field outside a coil in an asymmetrical structure.

$$H_2 \propto \frac{\alpha_3^2 J_3 e^{-jkr_3}}{4r_3^3} \sin\theta_3 - \frac{\alpha_2^4 J_4 e^{-jkr_4}}{4r_3^4} \sin\theta_4 \quad \text{Equation 3}$$

In Equations 2 and 3, the first term defines the magnetic field of the internal coil and the last term defines a compensating magnetic field of the outer metal.

According to Equations 2 and 3, it may be noted that an induced current is reduced and the strength of an external magnetic field is increased in the asymmetrical structure.

Figure 4:
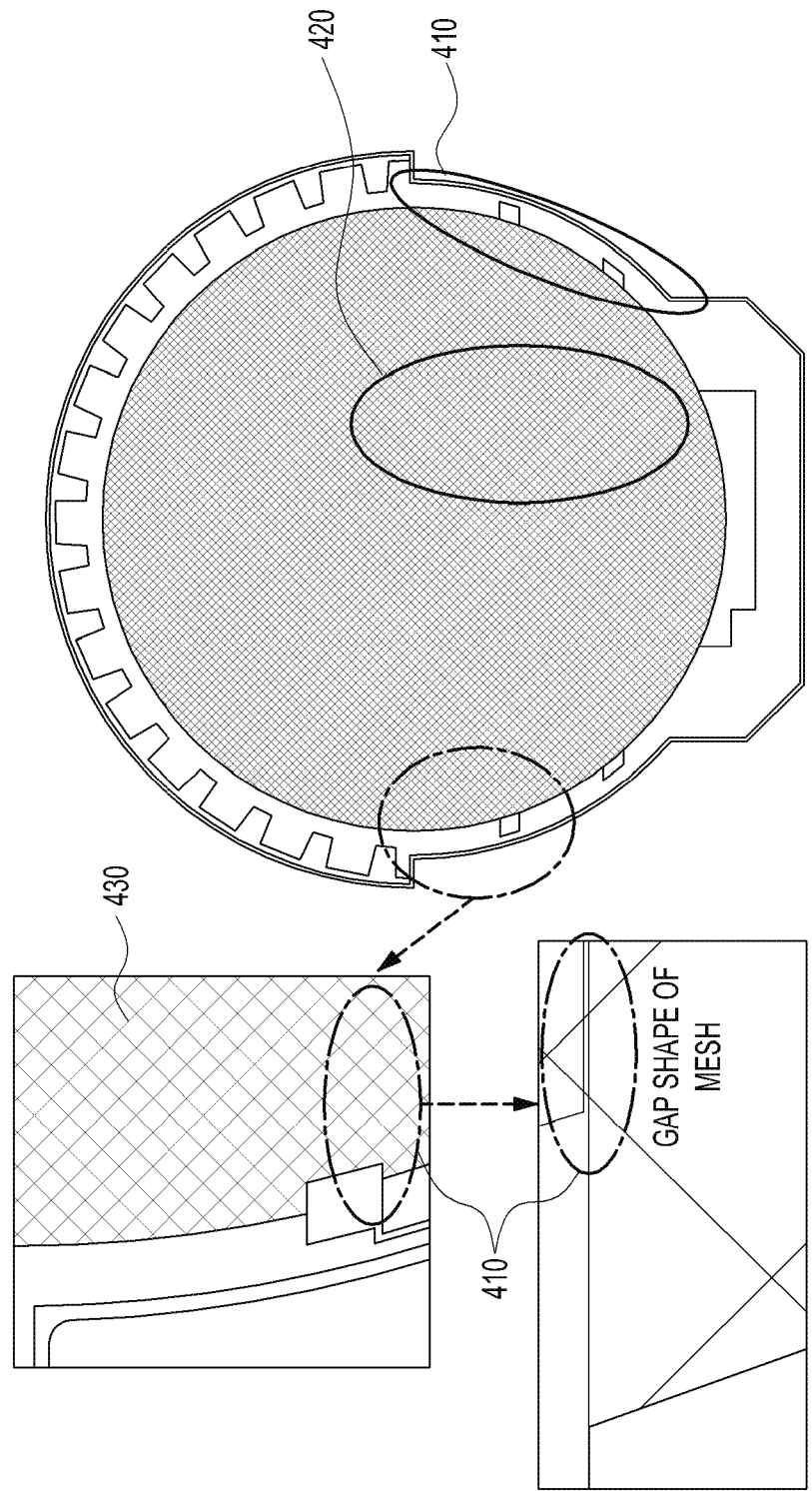
FIG. 4 illustrates a structure in which a coil is mounted inside a display according to various embodiments of the present disclosure.

FIG. 4 illustrates a structure in which a coil is mounted inside a display according to an embodiment of the present disclosure.

Referring to FIG. 4, the display may be divided into a black matrix (BM) area 410 using thin lines of a solid material and an active area 420 using transparent thick metal lines for securing a coil resistance. Particularly, the BM area 410 may be formed of a mesh 430 of thin metal lines. The mesh 430 may create gaps inside of the thin metal lines.

Figure 5:
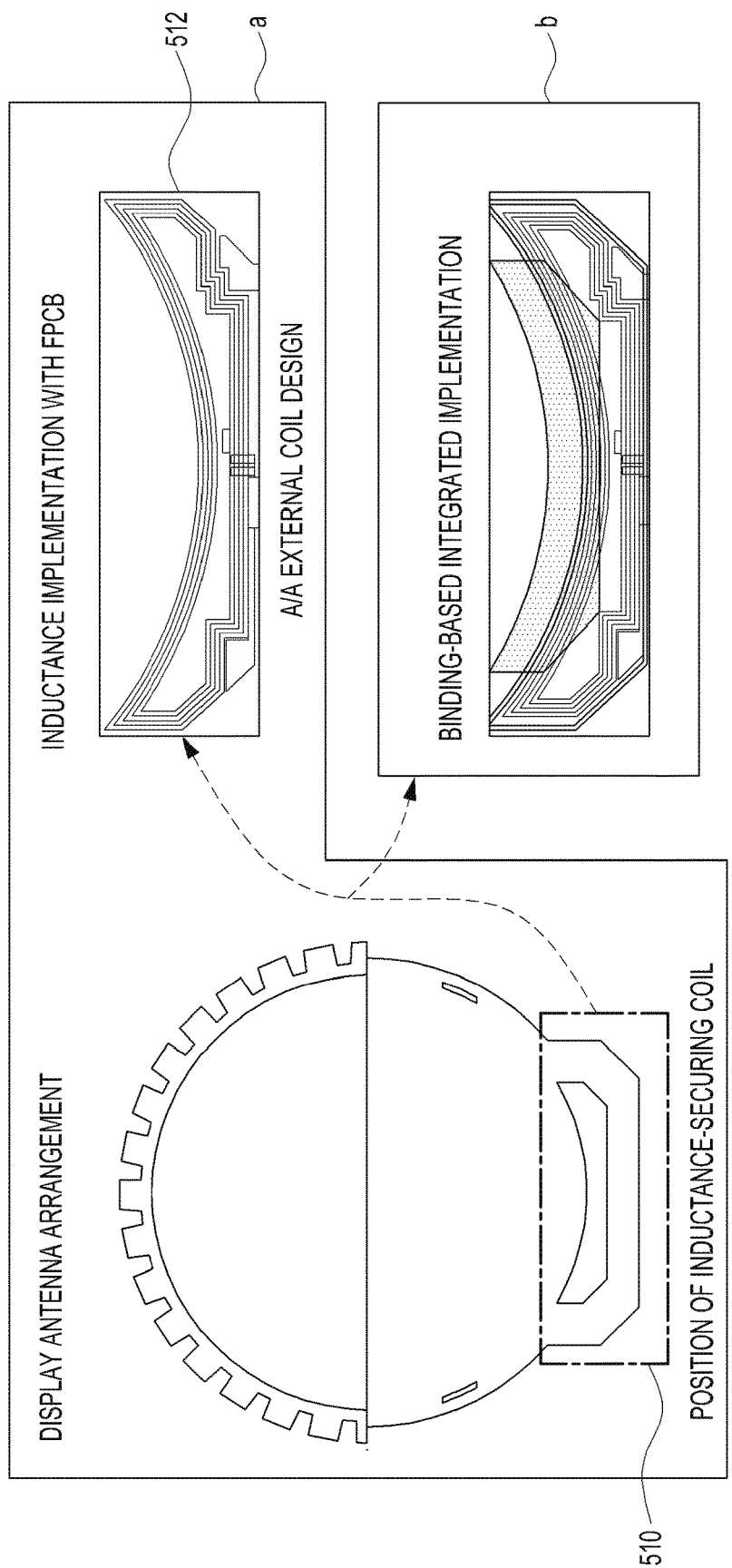
FIG. 5 illustrates an example of configuring a display antenna according to various embodiments of the present disclosure.

FIG. 5 illustrates an example in which a display antenna is configured according to various embodiments of the present disclosure.

Referring to FIG. 5, a display antenna 510 may include a coil 512 for restricting an inductance to a lower part of the display antenna 510. The inductance may be achieved by a flexible printed circuit board (FPCB) (a) or a binding-based integrated implementation (or lumped element) (b).

Herein, (a) represents an example of achieving an inductance by means of an FPCB. That is, coil 512 may correspond to an A/A external coil design, and (b) represents a binding-based integrated configuration. When the coil 512 is an integrated coil, the coil 512 may include a via therein.

For example, if a display antenna 510 is configured to include an integrated coil, the coil 512 may comprise separate coils such as a coil for securing an inductance and an H-field radiation coil.

Figure 6:
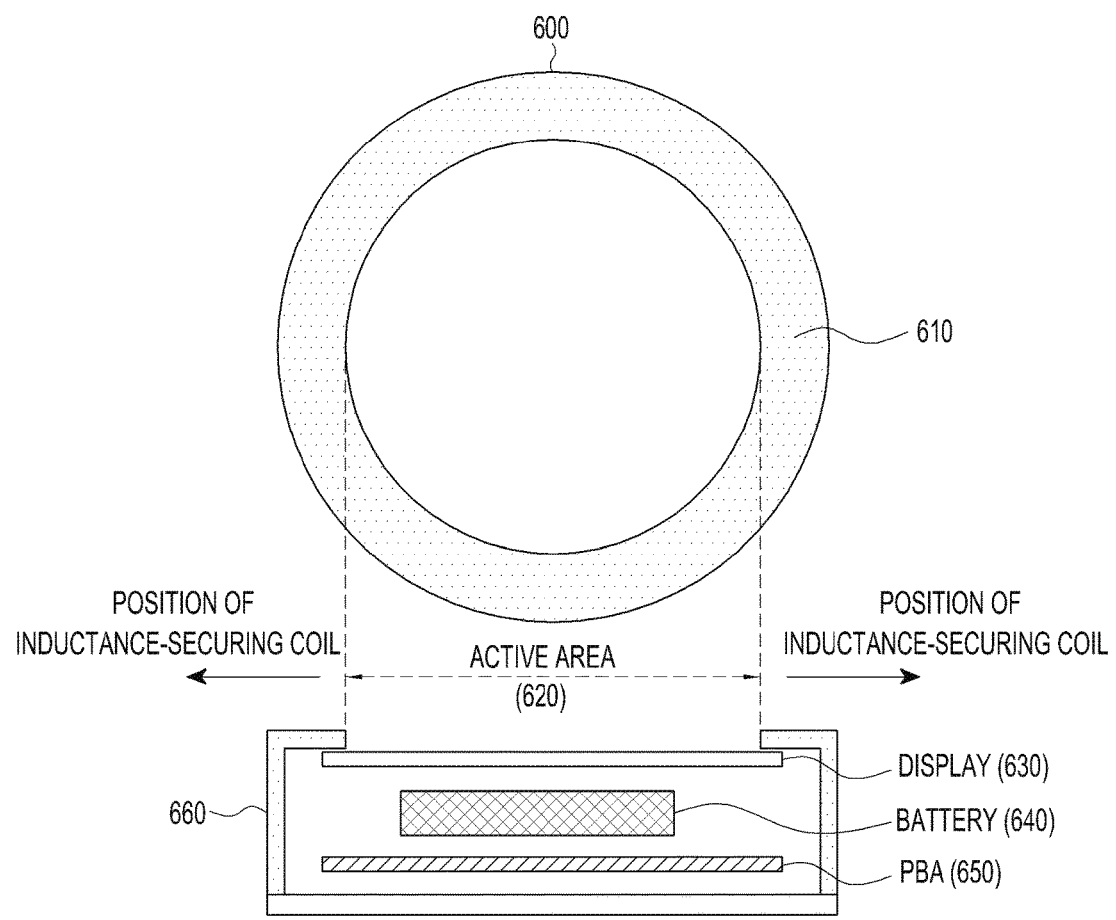
FIG. 6 illustrates a structure for securing inductance of a coil according to various embodiments of the present disclosure.

FIG. 6 illustrates a structure for securing the inductance of a coil according to various embodiments of the present disclosure.

Referring to FIG. 6, a metal ring 600 (for example, metal ring 140) may include a metal area 610 where an active area 620 is provided inside the metal ring 600. A coil (not shown) for generating an inductance in the metal ring 600 may be positioned outside the active area 620. A display 630, a battery 640, and a printed board assembly (PBA) 650 are stacked relative to the active area 620 of the metal ring 600 where the display 630, the battery 640, and the PBA are disposed within a body 660. In an exemplary embodiment, the coil may be a lumped element or an FPCB and may be arranged with respect to a BM area of the display 630 where the metal area 610 of the metal ring 600 may overlap the BM area of the display 630.

Figure 7:
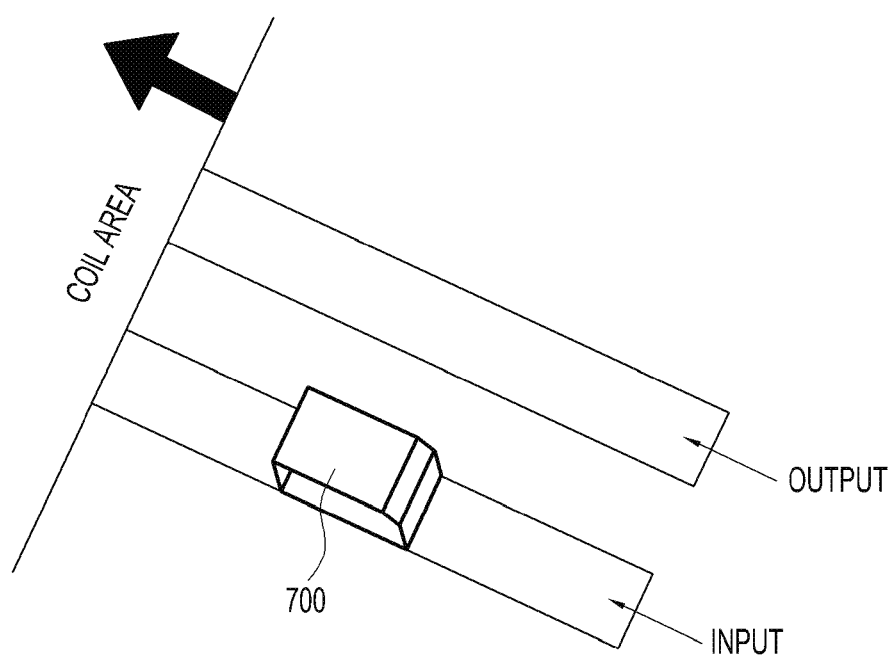
FIG. 7 illustrates an inductance compensation method according to various embodiments of the present disclosure.

FIG. 7 is a view illustrating an inductance compensation method according to various embodiments of the present disclosure.

Referring to FIG. 7, a lumped element 700 may be disposed at an input side from between an input from a power source and an output connected to a coil area. The lumped element 700 refers to a device with a uniform current distribution irrespective of the position of the lumped element 700. That is, the lumped element 700 is a lumped device attachable to a needed place because it has terminals at both ends. For example, the lumped element may be a chip-type resistor R, an inductor L, and/or a capacitor C.

In general, if a coil is arranged symmetrically within a metal frame, symmetrical areas are rendered to be solid in order to secure a gap L. As a result, a coil width W may be reduced. On the contrary, if the coil is arranged asymmetrically within the metal frame according to proposed various embodiments, the coil may be configured as a moving magnet (MM) for visibility, and the coil width W may be maximized to reduce R.

Figure 8:
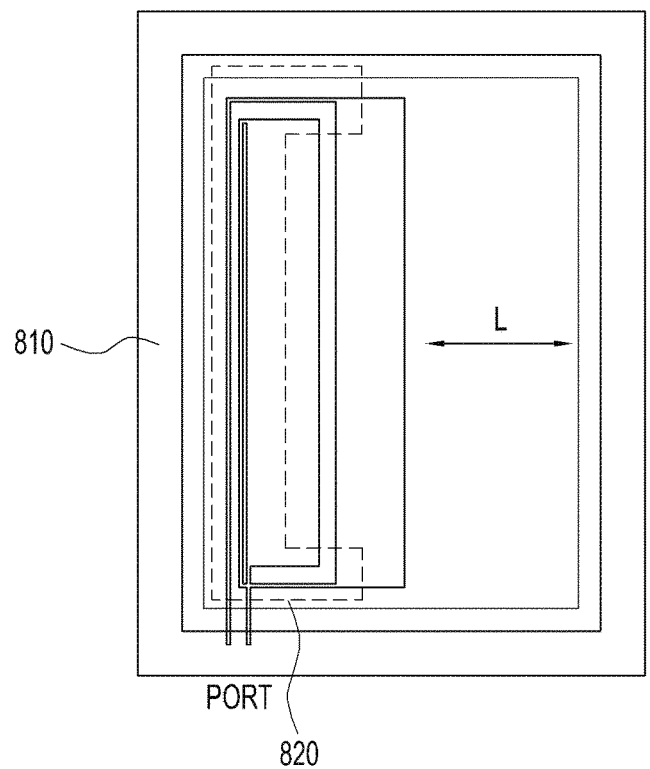
FIGS. 8, 9, and 10 illustrate asymmetrical structures according to various embodiments of the present disclosure.
Figure 9:
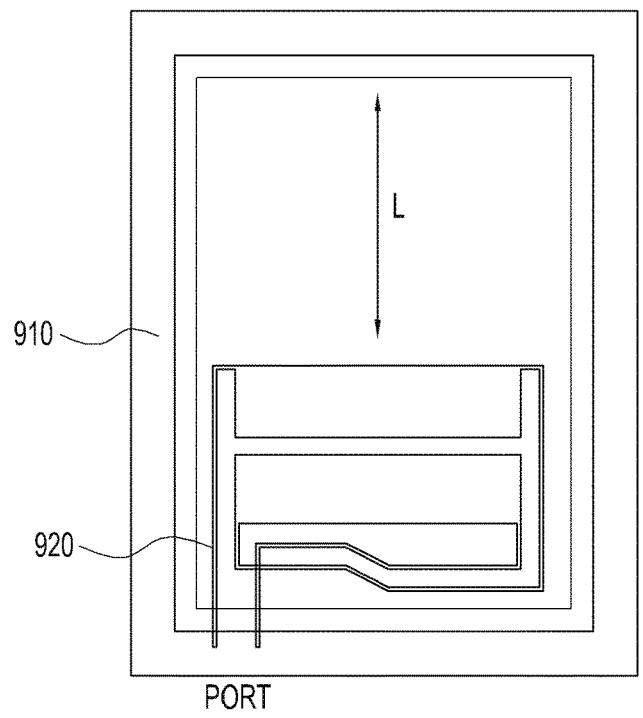
Figure 10:
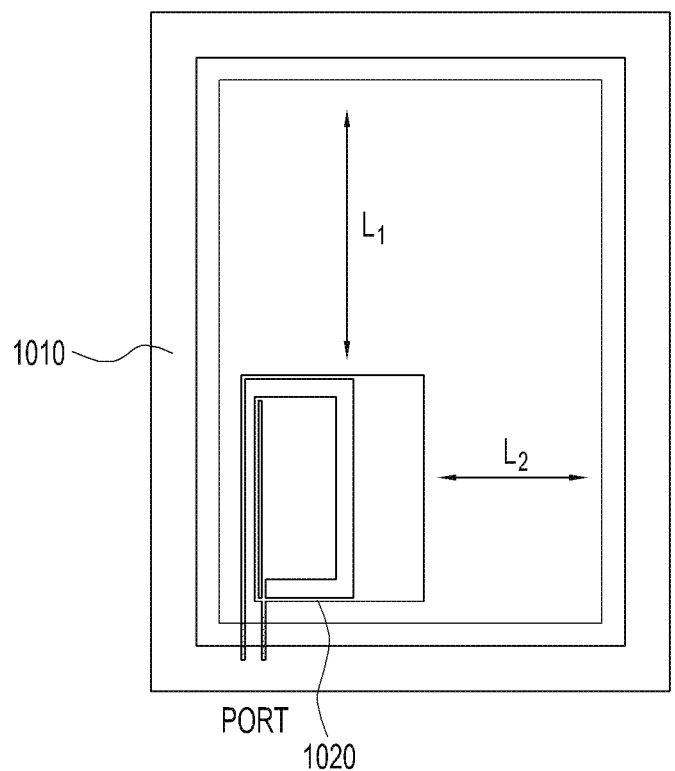

FIGS. 8, 9, and 10 illustrate asymmetrical structures according to various embodiments of the present disclosure.

FIG. 8 illustrates an example of a coil arranged asymmetrically with respect to one side.

FIG. 9 illustrates an example of a coil arranged asymmetrically with respect to one side.

FIG. 10 illustrates an example of a coil arranged asymmetrically with respect to two sides.

Referring to FIG. 8, a coil 820 is arranged at a left part of a metal frame 810 forming a gap or space at a right part of the metal frame 810 where a distance between the coil 820 and the right part of the metal frame 810 may be L.

Referring to FIG. 9, a coil 920 is arranged at a lower part of a metal frame 910 forming a gap or space at an upper part of the metal frame 910 where a distance between the coil 920 and the upper part of the metal frame 910 may be L.

Referring to FIG. 10, a coil 1020 is arranged at a left lower part of a metal frame 1010, forming gaps or spaces respectively at the upper and right parts of the metal frame 1010 where a distance between the coil 1020 and the upper part of the metal frame 1010 may be L1 and a distance between the coil 1020 and the right part of the metal frame 1010 may be L2.

While not shown, a coil may have an asymmetrical structure with respect to one side by arranging the coil at the right or upper part of a metal frame. Further, a coil may have an asymmetrical structure with respect to two sides by arranging the coil at a left upper, right upper, or right lower part of a metal frame.

Figure 11:
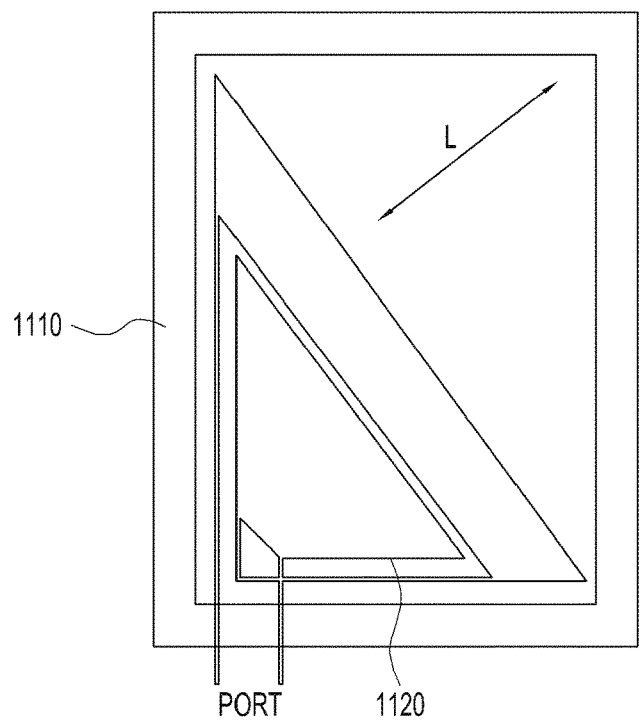
FIGS. 11, 12, and 13 illustrate asymmetrical coil arrangements according to various embodiments of the present disclosure.
Figure 12:
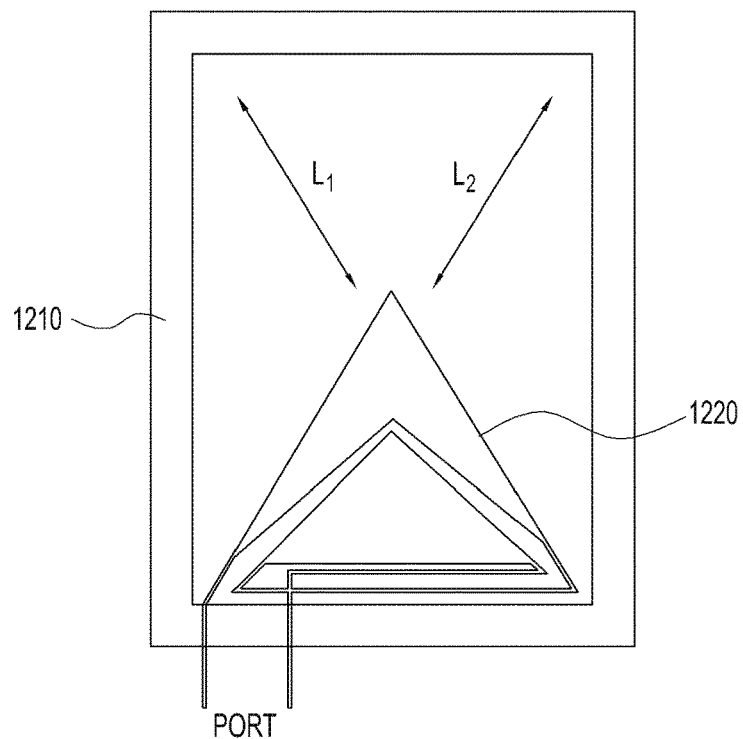
Figure 13:
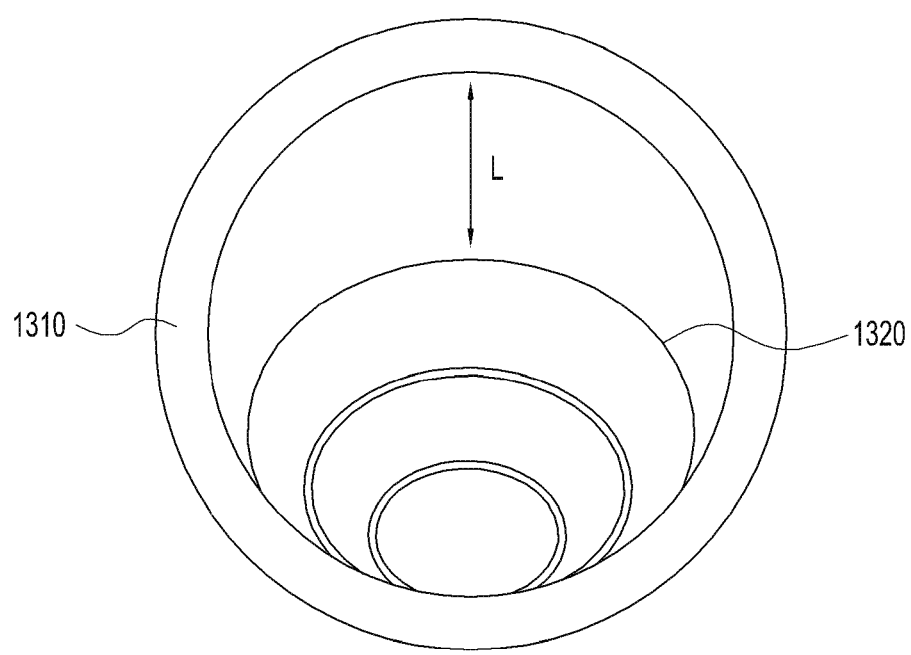

FIGS. 11, 12, and 13 illustrate examples in which a coil is arranged asymmetrically according to its shape according to various embodiments of the present disclosure.

Referring to FIG. 11, a coil 1120 is arranged in the form of a right triangle in a left lower part of a metal frame 1110 with respect to a line connecting between a left upper point and a right lower point of the coil 1120. In this case, a gap or space may be formed in a right upper part of the metal frame 1110 with respect to the line connecting between the left upper point and the right lower point of the coil 1120 where the distance between the coil 1120 and the right upper point of the metal frame 1110 may be L.

Referring to FIG. 12, a coil 1220 is arranged in the form of a regular triangle in a lower part of a metal frame 1210. In this case, gaps or spaces may be formed at left upper and right upper parts of the metal frame 1210 above the coil 1220 where the distance to an opposite angle in the left upper direction may be $L_1$, and the distance to an opposite angle in the right upper direction may be $L_2$.

Referring to FIG. 13, a metal frame 1310 is ring-shaped where a circular coil 1320 is arranged in a lower part of the metal frame 1310. In this case, a gap or space may be formed above the coil 1320 where a distance between the coil 1320 and an upper edge of the metal frame 1310 may be L.

As described above, a coil may be arranged in a different asymmetrical structure according to the shape of a metal frame, and according to the structure of the coil to be arranged in the metal frame in the proposed embodiments.

Figure 14:
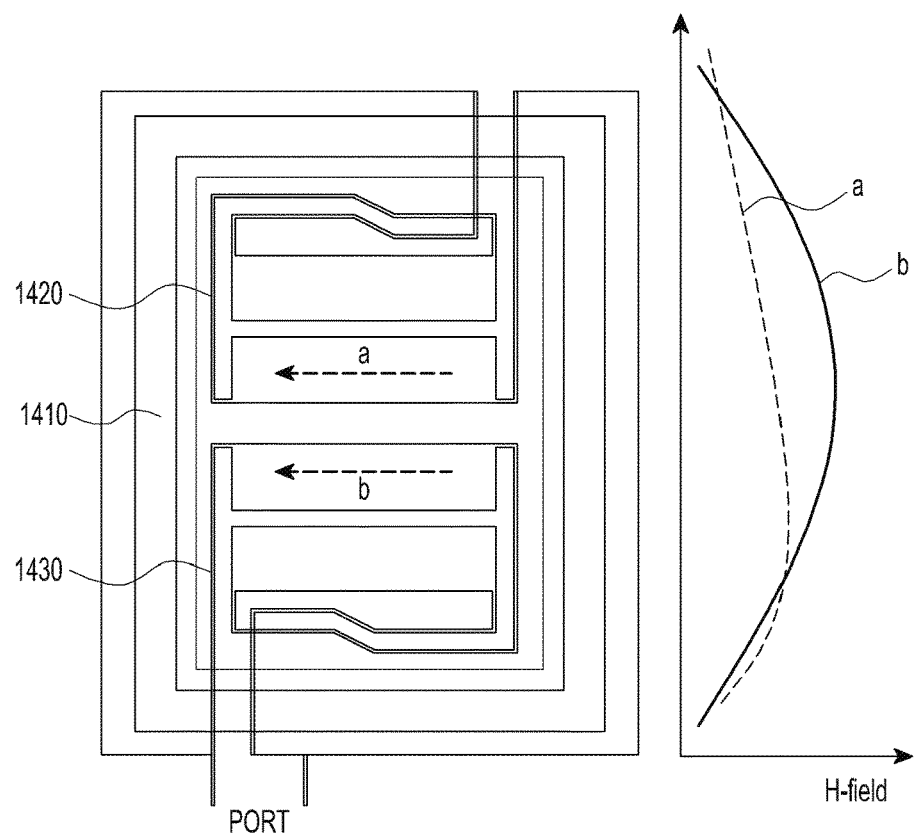
FIGS. 14 and 15 illustrate arrangements of a plurality of coils within a metal frame according to various embodiments of the present disclosure.
Figure 15:
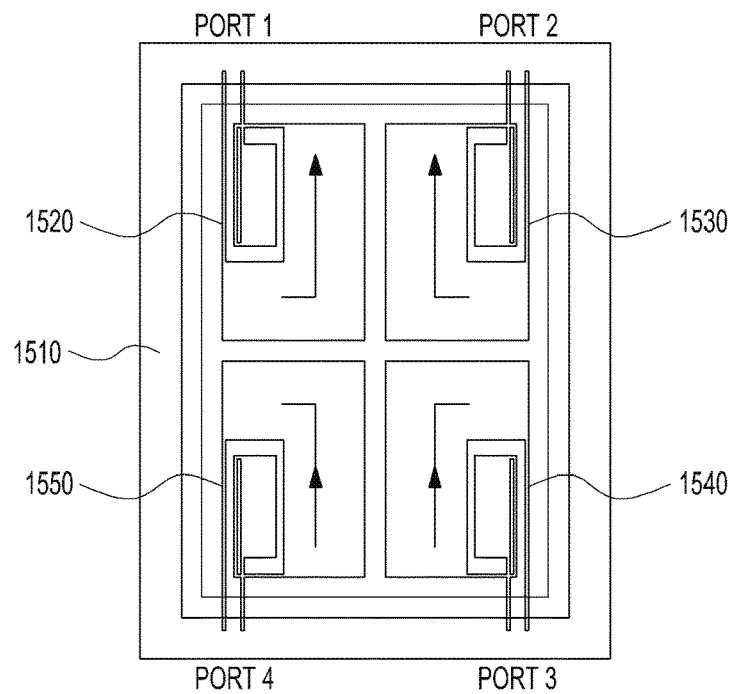

FIGS. 14 and 15 illustrate examples of arranging a plurality of coils in a metal frame according to various embodiments of the present disclosure.

Referring to FIG. 14, two coils 1420 and 1430 may be arranged inside a metal frame 1410. For example, the first coil 1430 is arranged asymmetrically in a lower part of the metal frame 1410. As the first coil 1430 is arranged asymmetrically, the second coil 1420 may be arranged in a space generated in an upper part of the metal frame 1410. However, to prevent current flowing through the first coil 1430 and current flowing through the second coil 1420 from counterbalancing each other, the first coil 1430 and the second coil 1420 are arranged in such a manner that a current (b) flowing in the first coil 1430 and flows in the same direction as a current (a) flowing in the second coil 1420.

Referring to FIG. 15, four coils 1520, 1530, 1540, and 1550 may be arranged inside a metal frame 1510. For example, the first coil 1520 is arranged asymmetrically in a left upper part of the metal frame 1510, the second coil 1530 is arranged asymmetrically in a right upper part of the metal frame 1510, the third coil 1540 is arranged asymmetrically in a right lower part of the metal frame 1510, and the fourth coil 1550 is arranged asymmetrically in a left lower part of the metal frame 1510.

However, to prevent currents flowing through the first coil 1520, the second coil 1530, the third coil 1540, and the fourth coil 1550 from counterbalancing each other, the first coil 1520, the second coil 1530, the third coil 1540, and the fourth coil 1550 are arranged in such a manner that current flows in the same direction in adjacent coils. However, when the first coil 1520, the second coil 1530, the third coil 1540, and the fourth coil 1550 are arranged within the metal frame 1510, currents may counterbalance each other between some adjacent coils.

Figure 16:
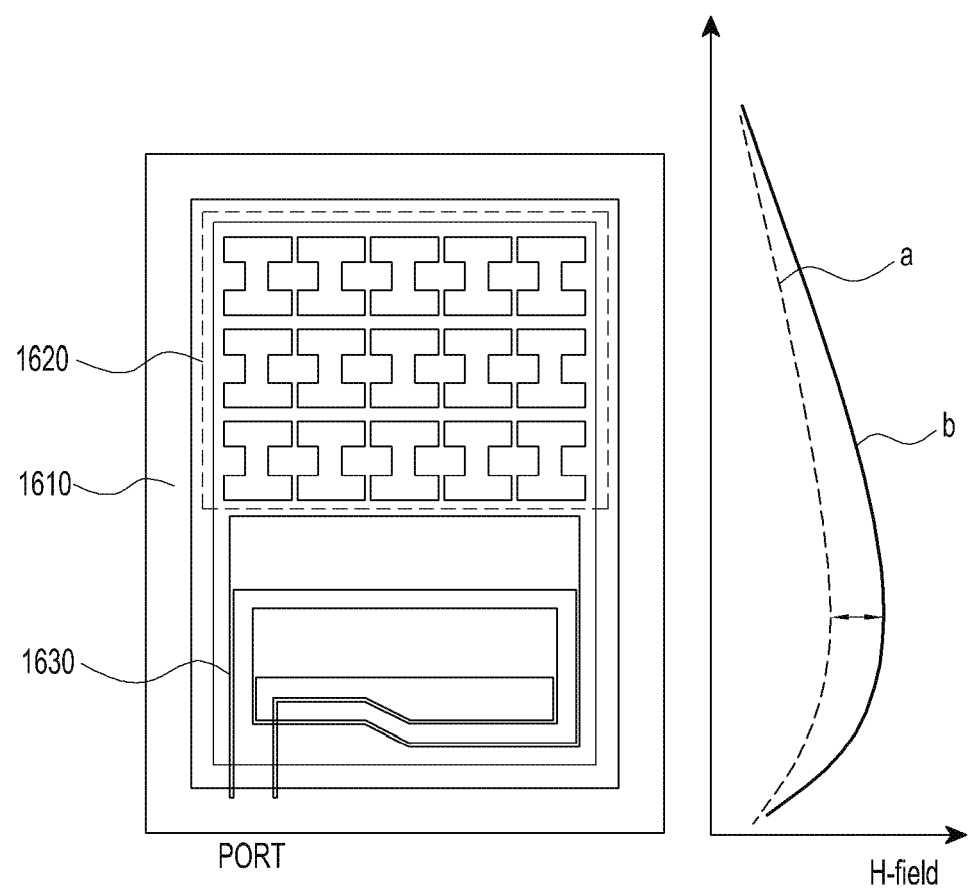
FIG. 16 illustrates an example of using an area resulting from asymmetrical arrangement of a coil within a metal frame according to various embodiments of the present disclosure.

FIG. 16 illustrates an example of utilizing an area resulting from arranging a coil asymmetrically in a metal frame according to various embodiments of the present disclosure.

Referring to FIG. 16, a coil 1630 may be arranged in a lower part of a metal frame 1610 and a periodic pattern 1620 may be provided in an area which is produced in an upper part of the metal frame 1610 as a result of the asymmetrical arrangement of the coil. This structure may maximize isolation between the coil 1630 and the metal frame 1610.

Figure 17A:
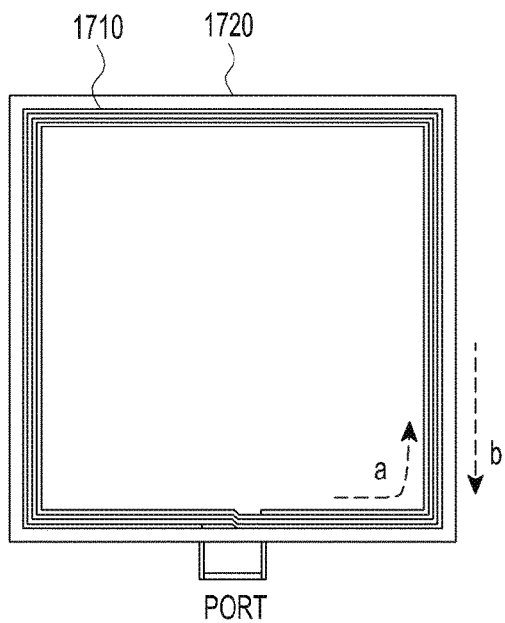
FIGS. 17A, 17B, and 17C illustrate a structure for compensating for an eddy current that may be caused by an asymmetrical coil arrangement according to various embodiments of the present disclosure.
Figure 17B:
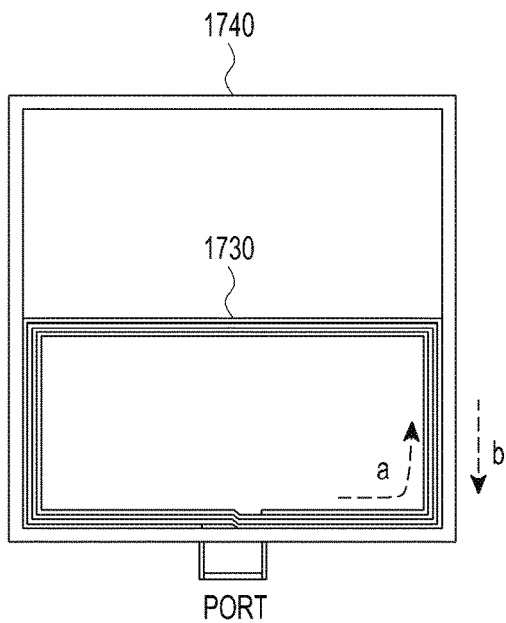
Figure 17C:
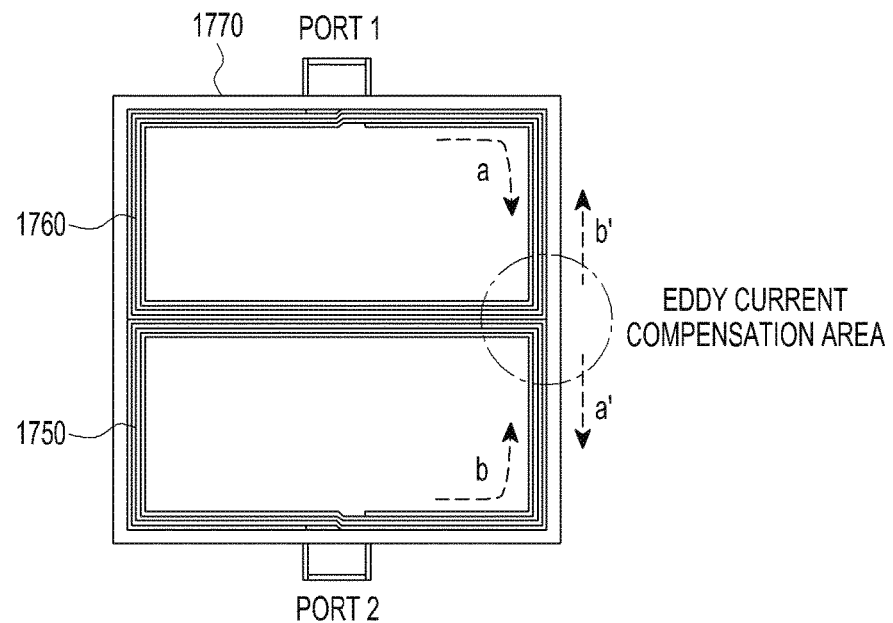

FIGS. 17A, 17B, and 17C illustrate a structure for compensating for an eddy current that may be generated in view of asymmetrical coil arrangement according to various embodiments of the present disclosure.

Referring to FIG. 17A, when a coil 1710 is arranged symmetrically inside a metal frame 1720, an eddy current (b) is generated in the metal frame 1720 due to current (a) flowing through the coil.

Referring to FIG. 17B, when a coil 1730 is arranged asymmetrically inside a metal frame 1740, an eddy current (b) is generated in the metal frame 1740 due to current (a) flowing through the coil.

It may be noted that the intensity of the eddy current generated in the metal frame 1720 in the symmetrical structure is relatively great, compared to the intensity of the eddy current generated in the metal frame 1740 in the asymmetrical structure.

Referring to FIG. 17C, when a first coil 1750 is arranged asymmetrically and a second coil 1760 is arranged in an area defined in a metal frame 1770, a first eddy current (a') is generated to compensate for the second eddy current (b') generated in the metal frame 1770 due to the second coil 1750.

In other words, as two coils are arranged in parallel in an asymmetrical structure, the strength of a magnetic field may be increased due to compensation for eddy current by simultaneous use of the two coils. In addition, the two coils may be operated independently.

Figures 18A, 18B:
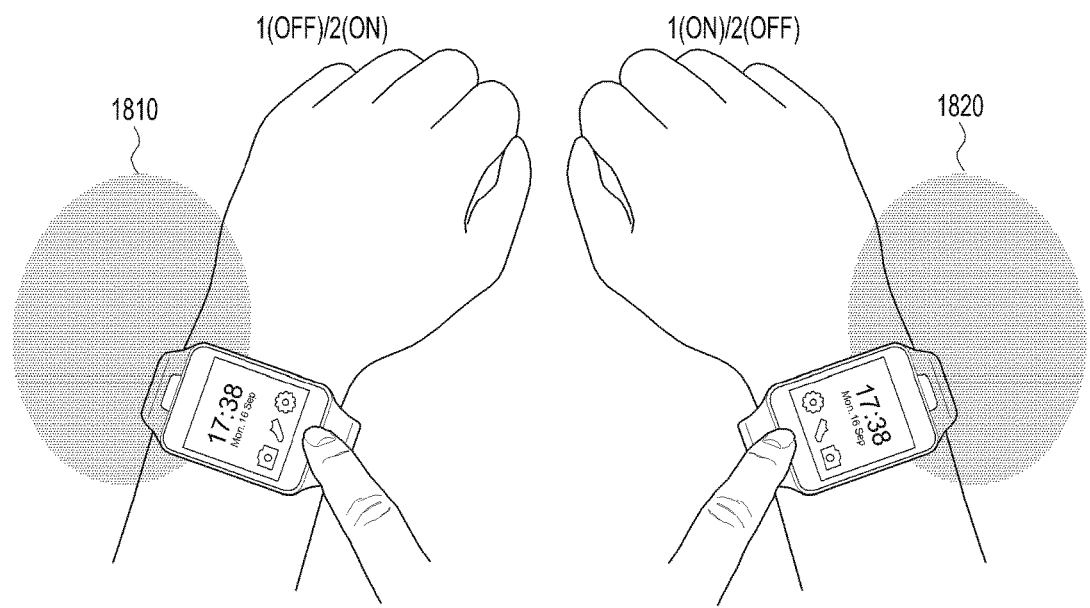
FIGS. 18A and 18B illustrate an example of using two asymmetrically arranged coils according to various embodiments of the present disclosure.

FIGS. 18A and 18B illustrate examples of utilizing two coils arranged asymmetrically according to various embodiments of the present disclosure.

Referring to FIGS. 18A and 18B, a beam is formed for communication by operation control of two coils arranged inside a metal frame. For example, if a wireless terminal with two coils arranged asymmetrically is, for example, a smart watch, one of the two coils may be operated selectively depending on a wrist around which a user wears the smart watch.

For example, if the smart watch is worn around the left hand as illustrated in FIG. 18A, one of the two coils may be operated (1—off, 2—on) so that a communication beam 1810 may be formed in an outward direction (to the left) from the left hand. If the smart watch is worn around the right hand as illustrated in FIG. 18B, the other coil may be operated (1—on, 2—off) so that a communication beam 1820 may be formed in an outward direction (to the right) from the right hand.

Figures 19A, 19B, 19C:
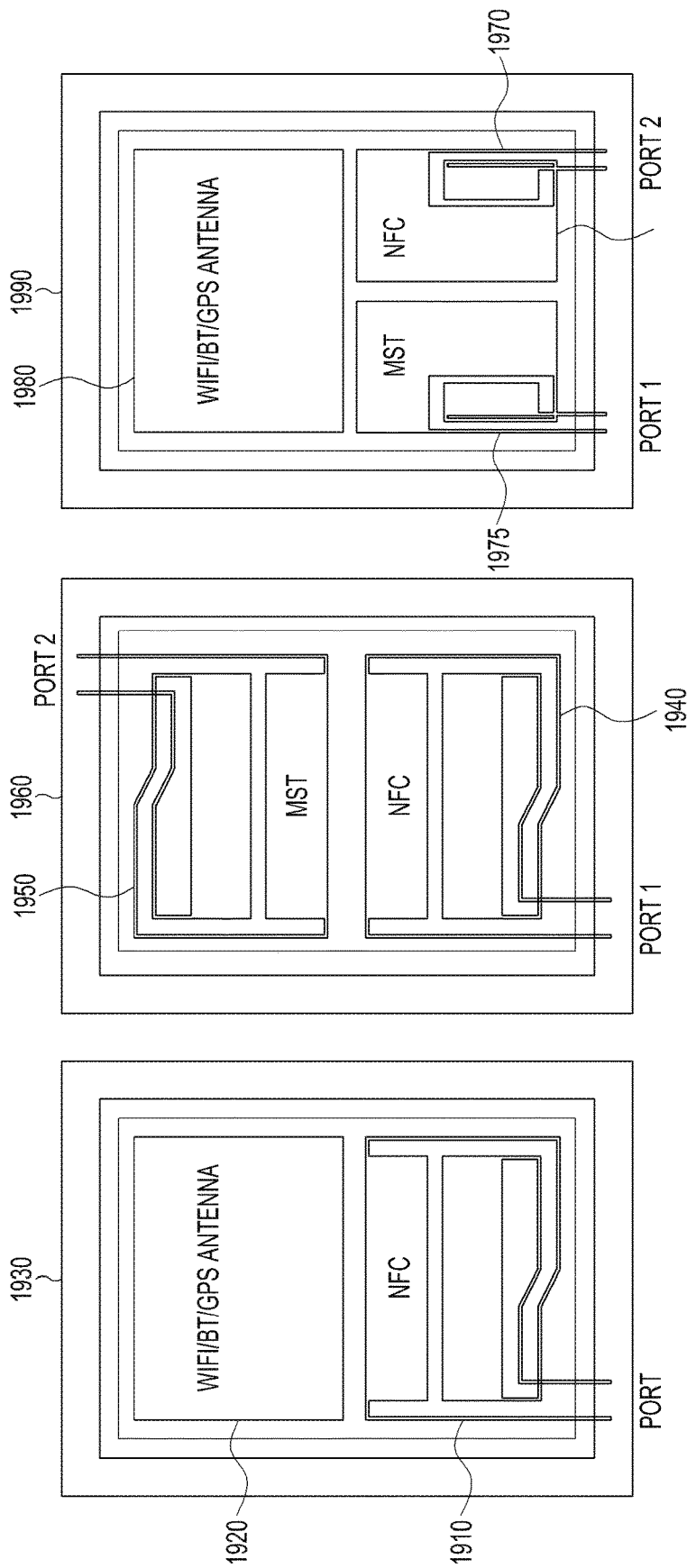
FIGS. 19A, 19B, and 19C illustrate asymmetrical arrangements of a plurality of coils or an antenna within a metal frame according to various embodiments of the present disclosure.

FIGS. 19A, 19B, and 19C illustrate examples of arranging a plurality of coils or an antenna asymmetrically within a metal frame according to various embodiments of the present disclosure.

Referring to FIG. 19A, one coil 1910 supporting NFC and an antenna 1920 supporting Wi-Fi/BT/GPS/3G are arranged asymmetrically in a metal frame 1930. For example, the coil 1910 is arranged asymmetrically in a lower part of the metal frame, and the antenna 1920 is arranged in an area which is produced in an upper part of the metal frame 1930 by the asymmetrical arrangement of the coil 1910.

Referring to FIG. 19B, a first coil 1940 supporting NFC and a second coil 1950 supporting magnetic secure transmission (MST) are arranged asymmetrically in a metal frame 1960. For example, the first coil 1940 is arranged asymmetrically in a lower part of the metal frame 1960, and the second coil 1950 is arranged in an area which is produced in an upper part of the metal frame 1960 by the asymmetrical arrangement of the coil 1940.

Referring to FIG. 19C, the first coil 1970 supporting NFC, the second coil 1975 supporting MST, and the antenna 1980 supporting Wi-Fi/BT/GPS/3G are arranged asymmetrically in a metal frame 1990. For example, the first coil 1970 is arranged asymmetrically in a right lower part of the metal frame 1990, and the second coil 1975 may be arranged in an area which is produced in a left lower part of the metal frame 1990 by the asymmetrical arrangement of the coil 1970. In addition, the antenna 1980 may be arranged in an area produced in an upper part of the metal frame 1990 by the asymmetrical arrangement of the first coil 1970 and the second coil.

As described above, various functions may be connected by space division of a display area. NFC and MST may be major examples of magnetic field communication, and Wi-Fi/BT/GPS/3G may be major examples of radio frequency (RF) communication.

Figure 20:
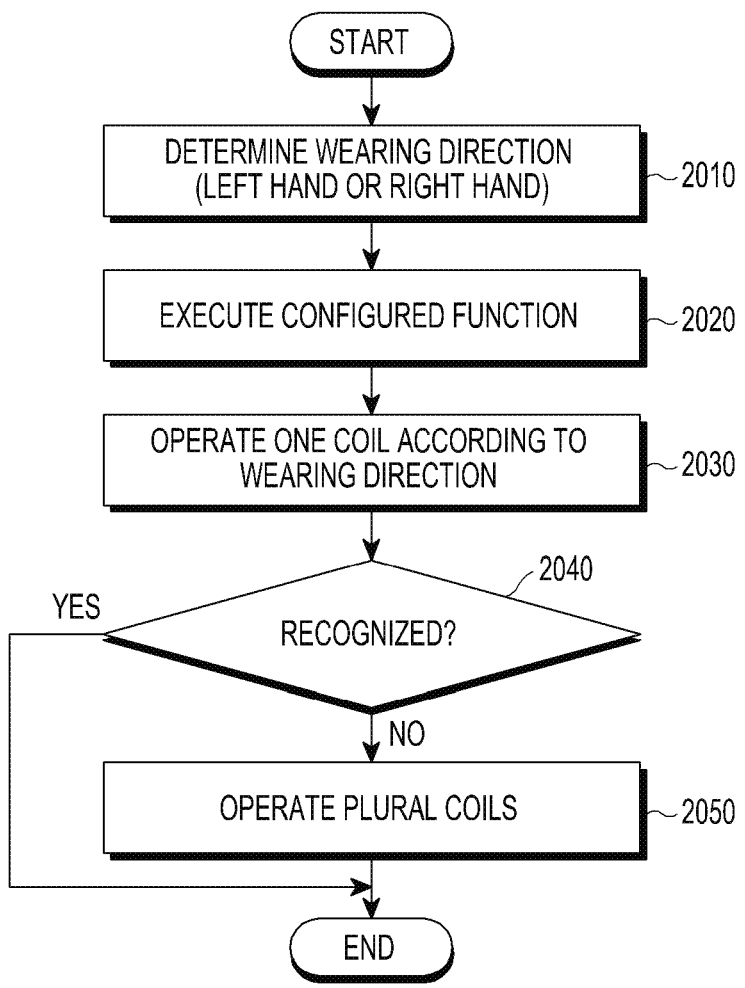
FIG. 20 is a flowchart illustrating a method for conducting communication using a plurality of coils arranged asymmetrically in a wireless terminal according to various embodiments of the present disclosure.

FIG. 20 is a flowchart illustrating an operation for conducting communication using a plurality of coils arranged asymmetrically in a wireless terminal according to various embodiments of the present disclosure.

Referring to FIG. 20, a wireless terminal determines a direction in which the wireless terminal is worn in operation 2010. For example, if the wireless terminal is a smart watch, it may be determined whether the smart watch is worn around the left or right wrist of a user. The determination may be made based on information input by the user, using at least one sensor (a gyro sensor, an accelerometer sensor, or the like), or using a camera. The wireless terminal executes a configured function in operation 2020. For example, the wireless terminal may execute a function that employs NFC or MST communication.

The wireless terminal selects at least one coil based on the determined wearing direction and the configured function and operates the selected coil in operation 2030. For example, if the smart watch is worn around the right wrist, the first coil may be operated, while the second coil may not be operated. On the other hand, if the smart watch is worn around the left wrist, the second coil may be operated, while the first coil may not be operated.

The wireless terminal determines whether the function may be executed by the operated coil combination in operation 2040. For example, if the function employs NFC communication, the wireless terminal determines whether a target device to communicate with by NFC exists. If the function employs MST communication, the wireless terminal determines whether a target device to communicate with by MST exists.

If a target device to communicate with is not found or recognized, the wireless terminal may operate another coil supporting the function to thereby execute the function based on the plurality of coils in operation 2050.

Figure 21:
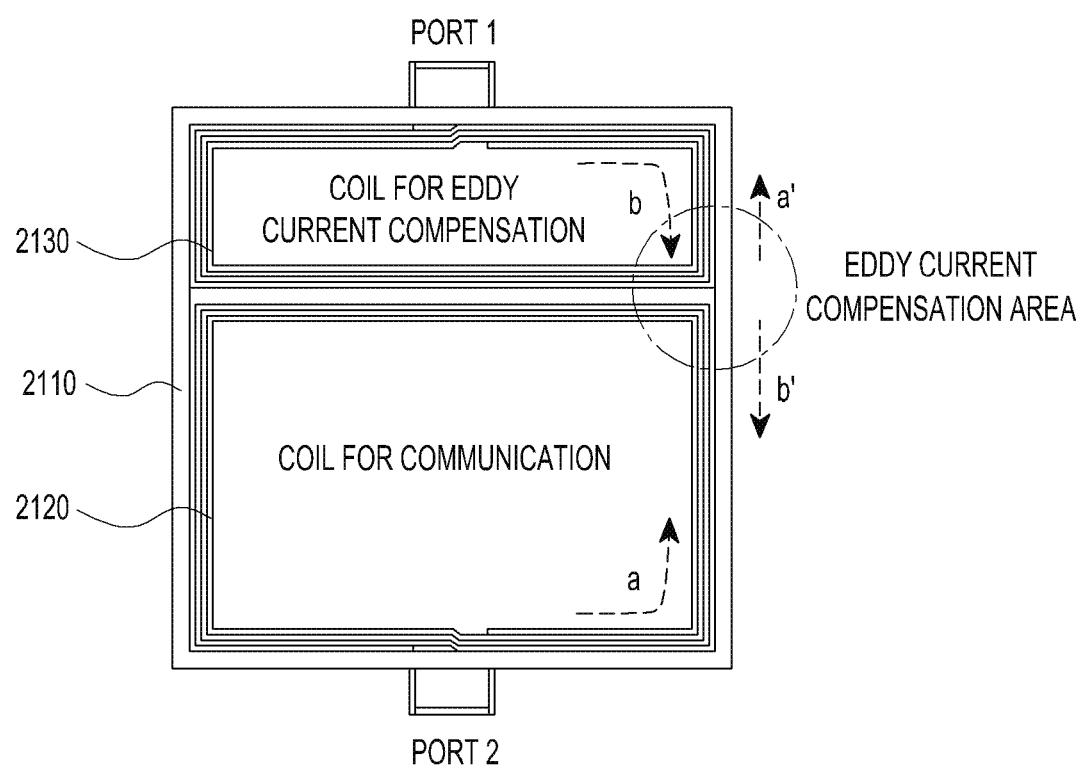
FIG. 21 illustrates a coil arrangement for compensating for an eddy current in a wireless terminal according to various embodiments of the present disclosure.

FIG. 21 illustrates a coil arrangement for compensating for an eddy current in a wireless terminal according to various embodiments of the present disclosure.

Referring to FIG. 21, when a first coil (a coil for communication) 2120 is arranged inside a metal frame 2110, an eddy current (a') may be generated in the metal frame 2110 due to a current (a) flowing through the first coil 2120.

As described before, as the first coil 2120 is arranged asymmetrically, an area may be formed within the metal frame 2110. A second coil (a coil for compensating for an eddy current) 2130 may be arranged in the area.

Eddy current (b') may be generated in the metal frame 2110 due to a current (b) flowing through the second coil 2130. The eddy current (b') may compensate for the eddy current (a') caused in the metal frame 2110 by the first coil 2120.

Figure 22:
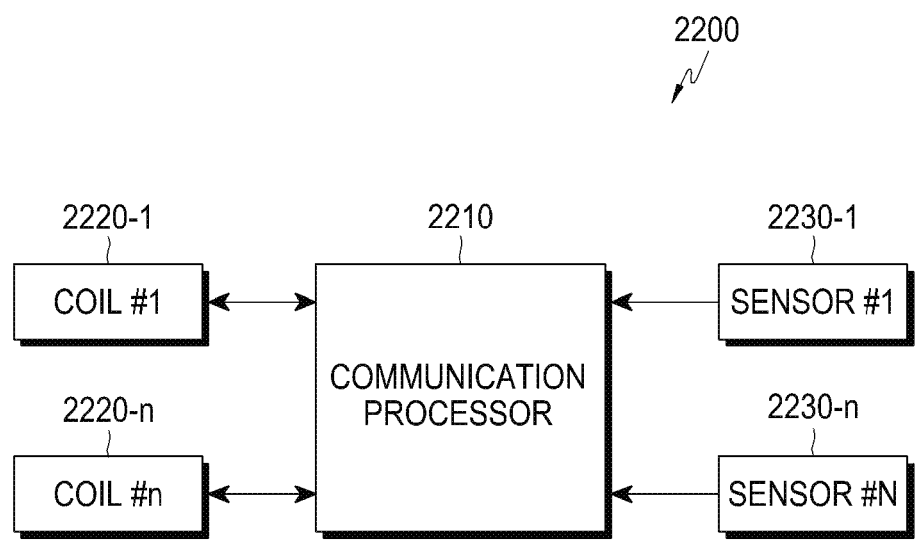
FIG. 22 is a block diagram of a wearable terminal as a wireless terminal according to various embodiments of the present disclosure.

FIG. 22 is a block diagram of a wireless terminal according to various embodiments of the present disclosure. The wireless terminal may be a wearable terminal.

Referring to FIG. 22, a wireless terminal 2200 may include one or more coils (coil #1 to coil #n) 2220-1 to 2220-n, respectively, one or more sensors (sensor #1 to sensor #n) 2230-1 to 2230-n, respectively, and a communication processor 2210.

A first coil 2220-1 to an nth coil 2220-n may be arranged integrally in an asymmetrical structure within a metal frame on the front surface of a display of the wireless terminal 2200. The asymmetrical structure refers to a structure in which the distance between an outer side of a coil and an inner side of the metal frame is not constant or symmetrical. The asymmetrical structure may be determined according to the shape of the metal frame of the wireless terminal 2200. For example, the asymmetrical structure of the coil may be determined to be one of a slant-line asymmetrical structure, a triangular asymmetrical structure, and a circuit asymmetrical structure.

According to an embodiment, one coil may be arranged asymmetrically inside the metal frame. At least one additional coil may be arranged in a gap or space produced by the asymmetrical coil arrangement within the metal frame, in such a manner that the at least one additional coil may have the same current direction as the asymmetrically arranged coil.

According to an embodiment, a second coil may be arranged in a gap or space within the metal frame. The space may be produced as a result of asymmetrically arranging a first coil within the metal frame. In this case, an eddy current induced in the metal frame by current flowing through the first coil may compensate for the eddy current induced in the metal frame by current flowing through the second coil.

According to an embodiment, a periodic pattern may be inserted in a space within the metal frame when a coil is arranged asymmetrically inside the metal frame of the wireless terminal.

According to an embodiment, at least one coil may be arranged integrally on a front surface of a display. A coil being a solid line may be arranged in a black matrix area at a peripheral part of the display, and a coil being a thick transparent metal line may be arranged in an active area at an inner part of the display. The coil being the solid thin line arranged in the black matrix area may be formed in a mesh. The mesh may have gaps inside it. Further, a lumped element or a flexible printed circuit board for securing inductance may be arranged in the black matrix area overlapped with the metal frame.

The communication processor 2210 may be configured to control operation of the at least one coil, coil #1 to coil #n 2220-1 to 2220-n. That is, one or more of coil #1 to coil #n 2220-1 to 2220-n may be operated by a command from the communication processor 2210.

Each of the at least one coil, coil #1 to coil #n 2220-1 to 2220-n may support communication in a different communication schemes or a plurality of coils from among the at least one coil, coil #1 to coil #n 2220-1 to 2220-n may support the same communication scheme.

According to an embodiment, in the case of a smart watch, each of the at least one coil, coil #1 to coil #n 2220-1 to 2220-n may be disposed in order to form a unique beam. In this case, a specific coil may be operated under the control of the communication processor 2210. The specific coil may be operated to form a beam for communication. That is, the smart watch may conduct communication in a beamformed direction. For example, it may be determined whether a wrist wearing the smart watch is the left or right wrist, and one of the at least one coil, coil #1 to coil #n 2220-1 to 2220-n may be selected to form a beam in an outward direction from the wrist wearing the smart watch.

The at least one coil, coil #1 to coil #n 2220-1 to 2220-n may be a gyro sensor, an accelerometer sensor, or the like. The at least one coil, coil #1 to coil #n 2220-1 to 2220-n may provide sensing information to the communication processor 2210.

For example, a sensor module including the at least one coil, coil #1 to coil #n 2220-1 to 2220-n may measure physical quantities or detect operational states of an electronic device, and convert the measured or detected information into electric signals. The sensor module may include at least one of, for example, a gesture sensor, a gyro sensor, an atmospheric pressure sensor, a magnetic sensor, an accelerometer sensor, a grip sensor, a proximity sensor, a color sensor (for example, a red, green, blue (RGB) sensor), a biometric sensor, a temperature/humidity sensor, an illumination sensor, or an ultra violet (UV) sensor. Additionally or alternatively, the sensor module may include, for example, an electrical-nose (E-nose) sensor, an electromyogram (EMG) sensor, an electroencephaloeram (EEG) sensor, an electrocardiogram (ECG) sensor, an infrared (IR) sensor, an iris sensor, and/or a finger print sensor. The sensor module may further include a control circuit for controlling one or more sensors included therein. According to various embodiments, the electronic device 201 may further include a processor configured to control the sensor module, as a part of or separately from the communication processor 2210. Thus, while the communication processor 2210 is in a sleep state, the control circuit may control the sensor module.

The communication processor 2210 may determine a wearing state of the wearable terminal based on a signal sensed through the at least one coil, coil #1 to coil #n 2220-1 to 2220-n. For example, the communication processor 2210 may determine whether a user wears the smart watch on the right or left wrist.

The communication processor 2210 may select at least one of the at least one coil, coil #1 to coil #n 2220-1 to 2220-n based on the determination, and command communication in a predetermined communication scheme using the selected at least one coil.

According to an embodiment, the communication processor 2210 may conduct communication in a predetermined communication scheme corresponding to the selected at least one coil, using the selected at least one coil, and if the communication is failed, command communication using at least one unselected coil from among the at least one coil, coil #1 to coil #n 2220-1 to 2220-n.

As is apparent from the foregoing description of the proposed various embodiments, since an asymmetrical coil structure reduces metal effects, a recognition distance for communication can be increased, and power consumption can be reduced.

While the present disclosure has been shown and described with reference to various embodiments thereof, it will be understood by those skilled in the art that various changes in form and details may be made therein without departing from the spirit and scope of the present disclosure as defined by the appended claims and their equivalents. This description is not necessarily intended to be exhaustive or to limit the invention to the precise embodiments disclosed. The specification describes specific examples to accomplish a more general goal that may be accomplished in another way. Those skilled in the art will appreciate that the features described above can be combined in various ways to form multiple variations of the invention.

What is claimed is:

1. A wireless terminal comprising:
a metal frame;
a display within the metal frame;
a first coil for an antenna within the metal frame, the first coil and the metal frame having a gap therebetween; and
a lumped element disposed on an input line or an output line of the first coil which connects the first coil to a power source,
wherein the first coil is disposed in a shape of a polygon, and nearest distances between at least two sides of the polygon and the metal frame are different.

2. The wireless terminal of claim 1, wherein the first coil overlaps the display, and a portion of the first coil arranged on an active area of the display comprises a transparent metal line.

3. The wireless terminal of claim 1, further comprising at least one second coil within the metal frame.

4. The wireless terminal of claim 3,
wherein one of the at least one second coil is formed on a flexible printed circuit board, and
wherein the one of the at least one second coil is not on an active area of the display.

5. The wireless terminal of claim 3, wherein a direction of a current in one of the at least one second coil and a direction of a current in the first coil are substantially same in an area where the one of the at least one second coil and the first coil are disposed closely.

6. The wireless terminal of claim 5, wherein the one of the at least one second coil is symmetrically disposed with the first coil.

7. The wireless terminal of claim 1, further comprising a periodic pattern between the first coil and the metal frame for increasing isolation between the first coil and the metal frame.

8. The wireless terminal of claim 3,
wherein the first coil is for a first communication scheme, and
wherein one of the at least one second coil is for a second communication scheme.

9. The wireless terminal of claim 1, wherein the shape of the first coil is one of a shape of a quadrangle and a shape of a triangle.

10. A wireless terminal comprising:
a circular metal frame;
a display within the circular metal frame;
a first circular coil within the circular metal frame, the first circular coil and the circular metal frame having a gap therebetween; and
a lumped element disposed on an input line or an output line of the first circular coil which connects the first circular coil to a power source,
wherein nearest distances between at least two portions of the first circular coil and the circular metal frame are different.

11. The wireless terminal of claim 10, wherein the first circular coil overlaps the display, and a portion of the first circular coil arranged on an active area of the display comprises a transparent metal line.

12. The wireless terminal of claim 10, further comprising at least one second coil within the circular metal frame.

13. The wireless terminal of claim 12,
wherein one of the at least one second coil is formed on a flexible printed circuit board, and
wherein the one of the at least one second coil is not on an active area of the display.

14. The wireless terminal of claim 12, wherein a direction of a current in one of the at least one second coil and a direction of a current in the first circular coil are substantially same in an area where the one of the at least one second coil and the first circular coil are disposed closely.

15. The wireless terminal of claim 14, wherein the one of the at least one second coil is symmetrically disposed with the first circular coil.

16. The wireless terminal of claim 10, further comprising a periodic pattern between the first coil and the circular metal frame for increasing isolation between the first circular coil and the circular metal frame.

17. The wireless terminal of claim 12,
wherein the first circular coil is for a first communication scheme, and
wherein one of the at least one second coil is for a second communication scheme.

* * * * *